(12) United States Patent
Ozasa

(10) Patent No.: US 6,219,220 B1
(45) Date of Patent: Apr. 17, 2001

(54) CERAMIC ELECTRONIC COMPONENT HAVING TERMINAL ELECTRODE THAT INCLUDES A SECOND POROUS LAYER

(75) Inventor: Toshiaki Ozasa, Oda (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/281,502

(22) Filed: Mar. 30, 1999

(30) Foreign Application Priority Data

Apr. 7, 1998 (JP) .................................................. 10-094518

(51) Int. Cl.$^7$ .................................................. H01G 4/228
(52) U.S. Cl. ........................ 361/309; 361/308.1; 361/310
(58) Field of Search ................... 361/303, 306.1, 361/308.1, 309, 310, 321.1–321.5

(56) References Cited

U.S. PATENT DOCUMENTS 4,701,827 * 10/1987 Fujikawa et al. ..................... 361/309
5,561,587 * 10/1996 Sanada ............................. 361/306.1

FOREIGN PATENT DOCUMENTS

| 2118366A | 10/1983 | (GB) . |
| 2272433A | 5/1984 | (GB) . |
| 8162359 | 6/1996 | (JP) . |

OTHER PUBLICATIONS

JAPIO Abstract No. 03885507 & JP4250607 A (Taiyo Yuden) 07.09.92.*
JAPIO Abstract No. 03885507 & JP4250607 A (Taiyo Yuden) 07.09.92.
JAPIO Abstract No. 03527310 & JP3190210 A (Matsushita) 20.08.91.
JP 3–190210 A (Matsushita Electric Ind. Co. Ltd.); Patent Abstracts of Japan, vol. 15, No. 448 (E–1133), 1991.11.14 (abstract).
JP 4–250607 A (Taiyo Yuden Co., Ltd.); Patent Abstracts of Japan, vol. 17, No. 28 (E–1308), 1993.01.19 (abstract).

* cited by examiner

*Primary Examiner*—Anthony Dinkins
(74) *Attorney, Agent, or Firm*—Ostrolenk, Faber, Gerb & Soffen, LLP

(57) ABSTRACT

The present invention provides an electronic component provided with the terminal electrode having a three layer structure comprising a first layer, a second layer and a third layer successively formed on each end face of the main electronic component, the second layer being a porous structure to advantageously absorb the stress caused by expansion and shrinkage of the wiring board, thereby preventing the main electronic component from suffering the stress, and the non-porous first layer maintaining good electrical continuity with the inner electrode while the non-porous third layer serving for preventing permeation of the solder liquid along with maintaining good electrical continuity to the outside, thereby preventing the ceramic component from being mechanically damaged due to expansion and shrinkage applied from the wiring board when the ceramic electronic component is packaged on the wiring board.

5 Claims, 1 Drawing Sheet

CERAMIC ELECTRONIC COMPONENT HAVING TERMINAL ELECTRODE THAT INCLUDES A SECOND POROUS LAYER

BACKGROUND OF THE INVENTION

1. Field of the Invention

The present invention relates to a ceramic electronic component and a method for producing the same, and especially to improvement in the structure of terminal electrodes provided with a chip of the main ceramic electronic component and to a method for producing the ceramic electronic component provided with such terminal electrodes.

2. Description of the Related Art

Examples of the ceramic electronic component provided with a chip of the main electronic component composed of a ceramic concerned with the present invention include a capacitor, a resistor, an inductor and a filter. These ceramic electronic components are mostly packaged on an appropriate wiring board.

In most ceramic electronic component packaged on the surface, an inner wiring is formed inside of the main electronic component and respective terminal electrodes are formed on at least on each side face of the main electronic component. Such ceramic electronic component is usually packaged by soldering the foregoing terminal electrodes to a given conductive land on the wiring board.

The ceramic electronic component suffers a deformation pulling toward each terminal electrode due to stress generated by shrinkage caused by solidifying solder. Consequently, mechanical damage such as crack formation in the main electronic component appears in the ceramic electronic component.

The mechanical damage in the ceramic electronic component is particularly liable to occur when the ceramic electronic component is packaged on a wiring board comprising aluminum which has good heat releasing property. Since the difference in heat expansion coefficient between the aluminum board and the ceramic electronic component is relatively large, cracks are generated in the main electronic component or in the solder fillet as a result of a repeated temperature increase and temperature decrease cycles.

This sort of mechanical damage is especially liable to be caused when a laminated ceramic capacitor of a high capacitance Pb based dielectric ceramic is packaged on the wiring board because the anti-fracture strength of the board is relatively weak.

For solving the foregoing problems, Japanese Unexamined Patent Publication No. 8-162359 proposes to relax the stress on the main electronic component applied via the terminal electrodes by making the terminal electrodes as a dual layer structure together with providing the inner layer with a porous structure.

However, the ceramic electronic component provided with the terminal electrodes having the dual layer structure described above still involves the following problems. The inner wiring formed inside of the main electronic component and the inner electrodes of a laminated ceramic capacitor, for example, should be electrically connected to the terminal electrodes whose inner layer serves to keep electrical continuity in the terminal electrodes having the dual layer structure described above. However, since this inner layer assumes a porous structure, it sometimes fails to keep sufficient electrical continuity with the inner wiring. Such insufficient electrical continuity becomes more evident as the laminated ceramic capacitor is made to be more compact.

SUMMARY OF THE INVENTION

Accordingly, the object of the present invention is to provide a ceramic electronic capacitor directed to solving the foregoing problems and a method for producing the same.

In a first aspect, the present invention provides a ceramic electronic component provided with a chip of a main electronic component in which inner wiring has been formed and terminal electrodes formed on the outer surface of the main electronic component so as to be electrically connected to the inner wiring, wherein the terminal electrodes is provided with a first layer formed on the outer surface of the main electronic component, a second layer formed at outside of the first layer and a third layer formed at outside of the second layer, the second layer having a porous structure.

Preferably, the second layer contains conductive particles with a particle size of about 3 to 6 $\mu$m More preferably, the first and third layers contain conductive particles with a particle size of about 0.5 to 2 $\mu$m and the second layer contains conductive particles with a particle size of about 0.5 to 2 $\mu$m and conductive particles with a particle size of about 3 to 6 $\mu$m.

In accordance with another aspect of the present invention, the method for producing a ceramic electronic component comprises the steps of preparing the main electronic component; forming a first conductive paste film containing conductive particles to be formed into the first layer by baking on the outer surface of the main electronic component; forming a second conductive paste layer containing conductive particles to be formed into the second layer by baking and an additive to be burnt out by baking at outside of the first conductive paste film; forming a third conductive paste layer containing conductive particles to be formed into the third layer by baking at outside of the second conductive paste film; and baking the first, second and third conductive paste films.

Further, the amount of the additive in the second conductive paste film may be controlled in order to adjust the void ratio in the porous structure of the second layer.

Also, it is preferable that a step for drying the second conductive paste film is further provided prior to the step for forming the third conductive paste film, wherein the second conductive paste film is baked simultaneously with the third conductive paste.

Gelatin, cellulose or carbon is advantageously used as the additive described above.

DESCRIPTION OF THE PREFERRED EMBODIMENT

Figure 1:
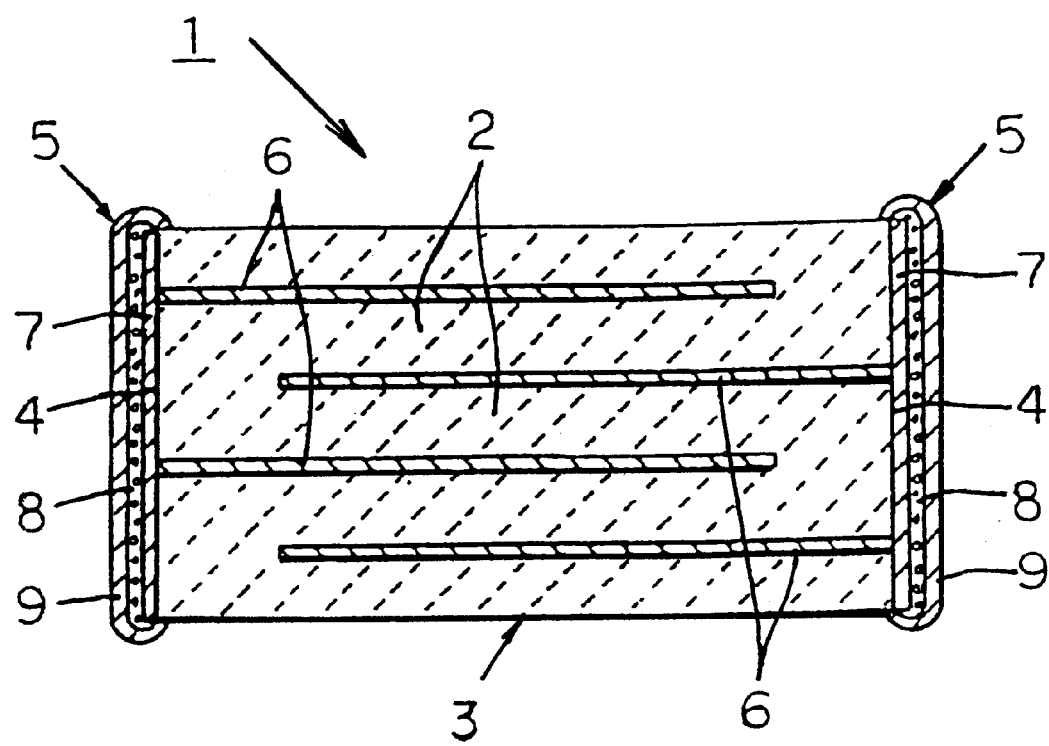
FIG. 1 denotes a cross section showing the ceramic electronic component 1 according to one embodiment of the present invention.

With reference to FIG. 1, the ceramic electronic component constitutes a laminated capacitor. The ceramic electronic component 1 is provided with a chip of the main electronic component 3 having a plurality of laminated ceramic capacitor layers 2, and terminal electrodes 5 formed at least on each end face 4 of the main electronic component 3. Details of the structure of the terminal electrodes 5 will be described hereinafter.

A plurality of inner electrodes 6 as an inner wiring are laminated inside the chip of the main electronic component 3. The inner electrodes 6 are to be connected to the terminal electrodes 5 at one end and at the other end are alternately disposed with each other.

The terminal electrodes 5 are provided with a first layer 7 formed on respective end faces 4 of the main electronic component 3, a second layer 8 formed at outside of this first layer 7 and a third layer 9 formed at outside of this second layer 8. The second layer 8 has a porous structure.

The ceramic electronic component 1 is produced by the steps comprising: preparing the main ceramic electronic component 3; forming a first conductive paste film containing conductive particles to be formed into the first layer 7 by baking on each end face 4 of the main ceramic component 3; forming a second conductive paste film containing conductive particles to be formed into the second layer 8 and an additive to be burnt out during baking so as to cover the first conductive paste film; and forming a third conductive paste film containing conductive particles to be formed into the third layer 9 by baking so as to cover the second conductive paste film.

Then, these first, second and third conductive paste films are baked, thereby forming the terminal electrodes 5 having the first layer 7, the second layer 8 and the third layer 9 on each end face of the main electronic component 3 while forming a porous structure in the second layer 8 by burning out the additive.

Although the first, second and third conductive paste films are usually baked at the same time in the baking step as described above, the first conductive paste film may be baked prior to, for example, forming the second conductive paste film. However, it is preferable that at least the second conductive paste film is dried before forming the third conductive paste film and the second conductive paste film is baked simultaneously with the third conductive paste film after forming the third conductive paste film.

The reason is that when the second conductive paste film is baked in advance of forming the third conductive paste film, the second conductive paste film is turned into the second conductive layer 8 having a porous structure during this step. The conductive particles contained in the third conductive paste film consequently penetrate into voids in the porous structure when the third conductive paste film is applied on the surface of the second layer 8, thereby canceling the porous nature of the second layer 8. When the conductive particles contained in the third conductive paste film penetrate into the voids of the second layer 8, the third layer 9 obtained by baking the third conductive paste film may also have a porous nature, resulting in deterioration of electric and mechanical characteristics of the ceramic electronic component 1 since the solder liquid permeates into the voids of the second layer 8 when a solder is applied on the third layer 9.

It is preferable that a substance that can be burnt out at a temperature lower than the baking temperature of the second conductive paste film is used as the additive contained in the second conductive paste to be formed into the second layer 8 described above. For example, gelatin, cellulose or carbon is advantageously used.

The void ratio in the porous structure of the second layer 8 can be adjusted by changing the amount of the foregoing additive in the second conductive paste film. While the optimum content of the additive can be determined by a heat cycle test or by an anti-fracture strength test of the ceramic electronic component 1 obtained, the optimum content of the additive is reduced as the ceramic electronic component 1 is compacted. It is preferable that the conductive paste prepared for forming the second conductive paste film is thoroughly kneaded in order to allow the conductive particles and additive to be uniformly dispersed in the paste.

While the conductive particles contained in the first and third conductive pastes to be formed into the first layer 7 and the third layer 9, respectively, preferably have relatively small particle size as about 0.5 to 2 $\mu$m, the second conductive paste film to be formed into the second layer 8 preferably contains conductive particles having a relatively small particle size of about 0.5 to 2 $\mu$m as well as particles having a relatively large particle size of about 3 to 6 $\mu$m.

The conductive particles having a relatively large particle size of, for example, about 3 to 6 $\mu$m contained in the second layer 8 allows the porous nature of the second layer 8 to be advantageously maintained even when the shrinking force caused by baking of the third layer 9 is applied on the second layer 8. In a specified embodiment, the conductive particles with a particle size of about 0.5 to 2 $\mu$m and the conductive particles with a particle size of about 3 to 6 $\mu$m are contained in the second layer 8 in a ratio of about 1:2. It is preferable in the conductive paste prepared for forming the second conductive paste film be thoroughly kneaded in order to uniformly disperse the conductive particles having different particle size distributions in the paste.

The second layer 8 contains the conductive particles having a relatively small particle size of, for example, about 0.5 to 2 $\mu$m in order to maintain good electrical continuity between the first layer 8 and the third layer 9, thereby allowing, for example, equivalent serial resistance to be reduced. The first layer 7 contains the conductive particles having a relatively small particle size of, for example, about 0.5 to 2 $\mu$m in order to maintain good electrical continuity between the layer and the inner electrodes 6. The third layer 9 also contains the conductive particles having a relatively small particle size of, for example, about 0.5 to 2 $\mu$m in order to keep a good electrical continuity in the third layer 9 along with preventing the solder liquid from permeating into the layer when solder is applied on the third layer 9.

The present invention described in relation to the laminated ceramic capacitors is also valid for the ceramic electronic components having other structures and functions, provided that the ceramic component is provided with a chip of the main electronic component in which inner wiring has been formed and with terminal electrodes formed on the outer surface of a chip of the main electronic component so as to be connected to the inner wiring.

Although it was suggested in the foregoing embodiments that solder films may be sometimes formed on the third layer 9, the terminal electrodes 5 are not always limited to such three layer structure comprising the first layer 7, the second layer 8 and the third layer 9, but at least one other layer may be further formed on the third layer 9 or other layers may be formed between the first layer 7 and the second layer 8 and/or between the second layer 8 and the third layer 9.

As hitherto described, stress applied during soldering to the wiring board or by expansion and shrinking of the wiring board is advantageously absorbed by the second layer with a porous structure and allows the terminal electrodes to effectively relax the stress exerting on the electronic device, thereby preventing mechanical damages in the main electronic component and at the terminal electrodes from being generated.

Since the first layer at the terminal electrode does not need to be endowed with a porous structure, good electrical continuity between the layer and the inner wiring formed within the electronic component can be maintained. The porous structure is also not needed in the third layer, thus maintaining good electrical continuity along with preventing permeation of the solder liquid.

The porous nature of the second layer can be well retained when the particle size of the conductive particles contained in the second layer is adjusted in the range of about 3 to 6 μm in the present invention.

The particle size of the conductive particles contained in the first and third layers are adjusted to about 0.5 to 2 μm while allowing the conductive particles with a particle size of about 0.5 to 2 μm and the conductive particles with a particle size of about 3 to 6 μm to be contained in the second layer. Accordingly, electrical continuity between the first layer and the inner wiring as well as good electrical continuity between the first layer and the third layer can be secured along with retaining porous nature of the second layer. Also, the solder liquid is prevented from permeating into the third layer besides keeping good electrical continuity in the third layer.

The porous structure in the second layer can be easily obtained according to the method for producing the ceramic electronic component of the present invention because the additive contained in the second conductive paste is burnt out by baking.

Also, the void ratio in the porous structure of the second layer can be controlled by adjusting the amount of the additive in the second layer. Accordingly, the second layer having a desired void ratio can be easily obtained by adjusting the amount of the additive as described above, making it easy to determine a proper void ratio in the ceramic electronic component having a variety of sizes by taking, for example, the results of a heat-cycle test and anti-fracture strength test of the ceramic electronic component into consideration.

The second conductive paste film is dried before forming the third conductive paste film in the method for producing the ceramic component according to the present invention so that the second conductive paste film and the third conductive paste film are simultaneously baked, thereby preventing undesirable permeation of the conductive particles contained in the third conductive paste film into the second layer having a porous structure obtained by baking the second conductive paste film. Accordingly, problems such as inhibition of the porous structure formation in the second layer or formation of the undesirable porous structure in the third layer can be avoided.

Also, the additive can be burnt out at a temperature lower than the baking temperature of the second layer when gelatin, cellulose or carbon is used as the additive contained in the second conductive paste film, allowing one to securely form the porous structure in the second layer.

What is claimed is:

1. A ceramic electronic component comprising a chip of an electronic component containing inner wiring and at least one terminal electrode on an outer surface of the electronic component electrically connected to the inner wiring, wherein the terminal electrode comprises a first layer on an outer surface of the electronic component, a second layer on the outside of the first layer and a third layer on the outside of the second layer, and wherein the second layer is porous.

2. A ceramic electronic component according to claim 1 having two of said terminal electrodes disposed at different sites on the outer surface of the electronic component.

3. A ceramic electronic component according to claim 2, wherein the second layer comprises baked conductive particles of a particle size of about 3 to 6 μm.

4. A ceramic electronic component according to claim 3, wherein the first, second and third layers each comprise baked conductive particles of a particle size of about 0.5 to 2 μm.

5. A ceramic electronic component according to claim 2, wherein the first, second and third layers each comprise baked conductive particles of a particle size of about 0.5 to 2 μm.

* * * * *